United States Patent [19]

Piguet et al.

[11] 4,242,676
[45] Dec. 30, 1980

[54] INTERACTIVE DEVICE FOR DATA INPUT INTO AN INSTRUMENT OF SMALL DIMENSIONS

[75] Inventors: Christian Piguet; Jean-Félix Perotto, both of Neuchâtel, Switzerland

[73] Assignee: Centre Electronique Horloger SA, Neuchâtel, Switzerland

[21] Appl. No.: 968,917

[22] Filed: Dec. 13, 1978

[30] Foreign Application Priority Data

Dec. 29, 1977 [CH] Switzerland ............... 16178/77
Jul. 17, 1978 [CH] Switzerland ............... 7690/78

[51] Int. Cl.³ .............................................. G06F 3/14
[52] U.S. Cl. .............................. 340/711; 340/365 C; 340/712; 340/718; 178/18
[58] Field of Search ............... 340/712, 365 R, 365 C, 340/711, 718; 178/18

[56] References Cited

U.S. PATENT DOCUMENTS

| | | | |
|---|---|---|---|
| 3,151,239 | 9/1964 | Lecoart et al. | 178/18 |
| 3,758,718 | 9/1973 | Fletcher et al. | 178/18 |
| 3,916,099 | 10/1975 | Hlady | 178/18 |
| 4,005,400 | 1/1977 | Engdahl | 178/18 |
| 4,013,835 | 3/1977 | Eachus et al. | 178/18 |
| 4,044,242 | 8/1977 | Laesser | 340/365 R |
| 4,055,726 | 10/1977 | Turner et al. | 178/18 |
| 4,070,649 | 1/1978 | Wright, Jr. et al. | 178/18 |
| 4,122,438 | 10/1978 | Bird | 178/18 |
| 4,126,760 | 11/1978 | Gordon | 178/18 |
| 4,149,029 | 4/1979 | Pobgee | 178/18 |

FOREIGN PATENT DOCUMENTS 2505227 11/1975 Fed. Rep. of Germany .
2517769 10/1976 Fed. Rep. of Germany .

OTHER PUBLICATIONS

IBM Tech. Discl. Bull.; vol. 19, No. 7; 12/76; Niederreiter *Single Key Element Data Input;* pp. 2585-2586.

*Primary Examiner*—Marshall M. Curtis
*Attorney, Agent, or Firm*—Wender, Murase & White

[57] ABSTRACT

The device according to the invention comprises a sensor formed by a plurality of capacitive or resistive electrodes. The user searches the symbol to be selected by displacing his finger on the sensor while looking at a control display unit. Any position of the finger on the sensor causes the display of to at least one symbol within an alphanumeric group, these symbols appearing sequentially on the control display.

The device does not require any instruction for use nor any indicator marked on the instrument because its working principle is based on permanent visual feedback. The device is compatible with the dimensional requirements of portable instruments of small dimensions, e.g. timepieces.

22 Claims, 16 Drawing Figures

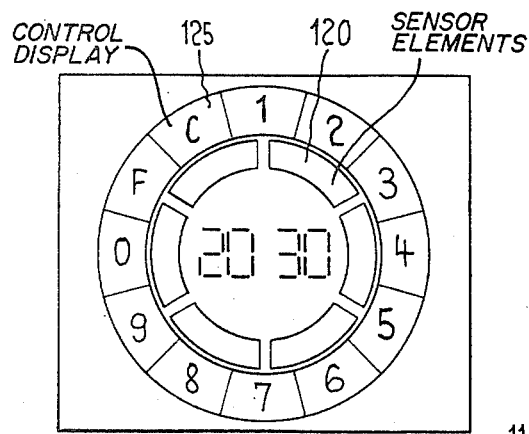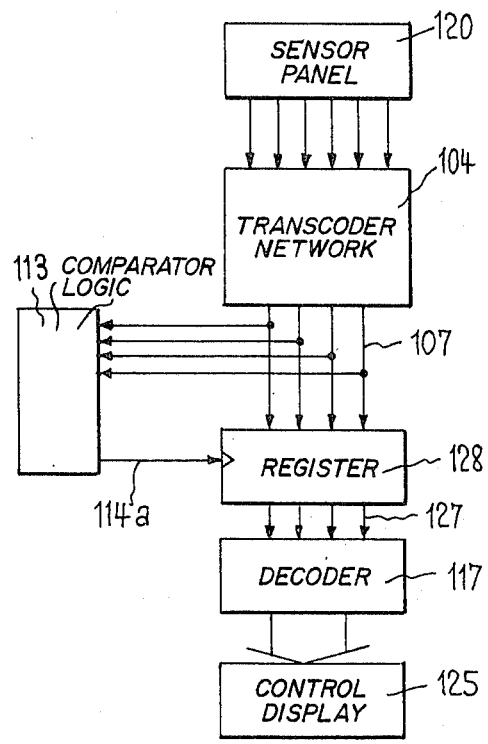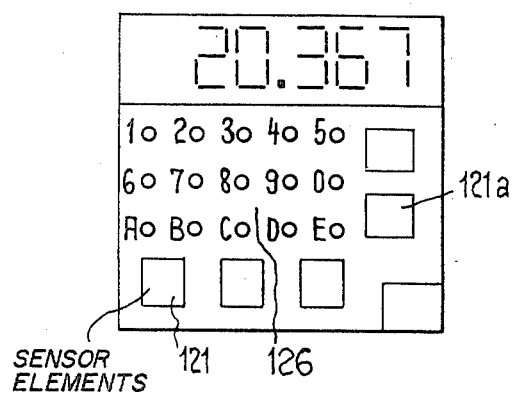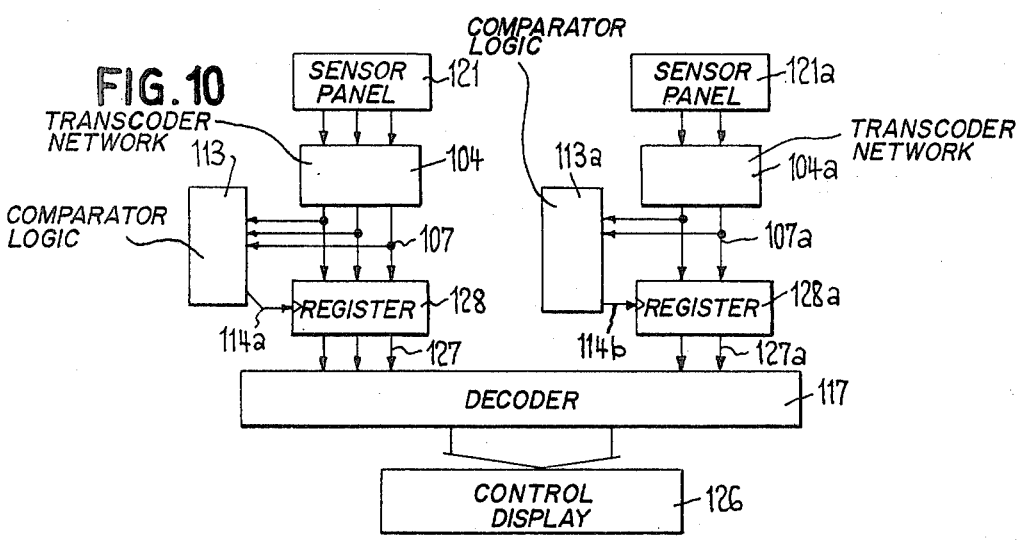

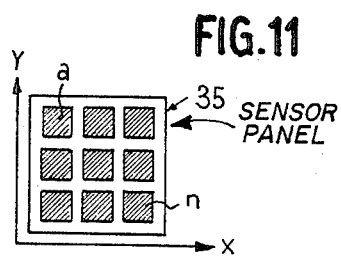
FIG.11
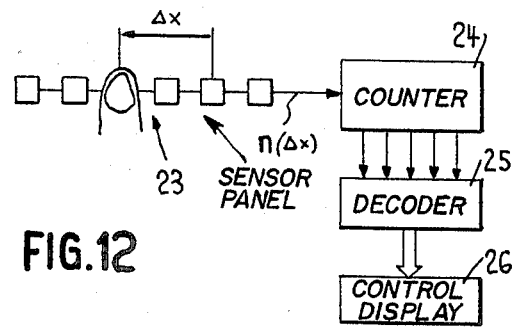
FIG.12
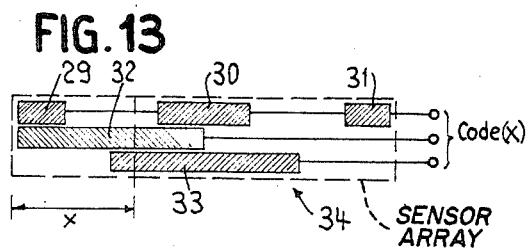
FIG.13
FIG.14
A B C D E F G ······ Z
FIG.15
ABC DEF GHI JKL MNO PQR ······ XYZ
FIG.16
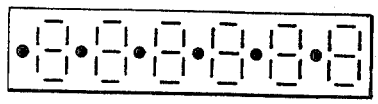

INTERACTIVE DEVICE FOR DATA INPUT INTO AN INSTRUMENT OF SMALL DIMENSIONS

BACKGROUND OF THE INVENTION

The invention relates to an interactive device for data input into an instrument of small dimensions comprising at least one manually actuated sensor, a control display unit and electronic conversion, memorization and decoding means.

The principal problem which is encountered with a manually actuated data input device intended for an instrument of small dimensions, e.g. for an electrode watch, is the small number of sensor elements (keys or transducers) that can be resolved or actuated individually with one finger only. This small number of sensor elements limits the effective size of an alphanumeric group (hereinafter referred to as an alphabet) which is directly accessible.

The prior art, as indicated below, shows that all data input devices need an additional element in order to be used practically. The additional element may be the instructions for use that the user must assimilate in order to utilize the device efficiently (e.g.: written data input) or a set of indications associated with the input elements like inscriptions written on keys, for example.

U.S. Pat. No. 3,803,834 discloses a wristwatch provided with a calculator having keys for data input and for the selection of the functions, each key being marked with the corresponding cipher or symbol. Such miniature keyboards cannot be actuated by one finger and a stylus is required to actuate the individual keys.

U.S. Pat. No. 3,757,322 shows translucent keys under which a display is provided in order to display the symbol corresponding to the key. The keys which are grouped in a keyboard may be considered as multifunction keys because it is foreseen to change the keyboard, e.g. to change from letters to ciphers, and so on.

Swiss Pat. No. 533 332 shows a system provided with a display to sequentially display the data as it is delivered by a circuit intended to this end, the system containing a control element which permits entry of the desired information. Such a system requires only a small number of keys but is slow in operation.

U.S. Pat. No. 3,309,785 shows a writing area where symbols may be written. The area is provided with sensors which react to the passage of one finger or one pencil. The order of passages being considered, the area produces a sequence of signals from which a circuit recognizes the symbol and controls the display of it. The user of such a device must undergo an apprentiship to learn how to write the symbols in the right way.

The DAS No. 2 235 620 shows an interacting display having a writing area provided with 14 sensor elements and a display with 14 segments which are disposed without any relation to the writing of the symbols. It results from this condition that the user must learn for each of the 36 symbols (letters and ciphers) the configuration prescribed by the manufacturer of the device, where each symbol is written on at least part of 14 electrodes. Such a data input is impracticable for an average person.

SUMMARY OF THE INVENTION

The object of the present invention is to provide an interactive device for data input which does not present the disadvantages of the prior art, as indicated above, and which is compatible with the dimensional requirements of portable instruments of small dimensions, e.g. timepieces.

Another object of the invention is to provide an interactive device for data input capable of being manually actuated and delivering information which is representative of the position of a finger on a sensor, the information being independent of the breadth of the finger.

The interactive device for data input into an instrument of small dimensions according to the present invention comprises at least one manually actuated sensor, a control display unit and electronic conversion, memorization and decoding means, wherein the sensor comprises a plurality of electrodes, each position of the finger on the sensor causing the display of to at least one of the symbols of an alphabet in order to permit the search and the selection of alphanumeric data which appears sequentially on the control display unit in function of the information delivered by the sensor.

The device does not require any instructions for use nor indications marked on the instrument because its working principle is based on permanent visual feedback. The user searches the symbol to be selected by displacing his finger on the sensor while looking at the control display unit. The complex man-machine is a servo system operating exactly like the similar situation wherein a potentiometer is manually adjusted for regulating the acoustic level of an amplifier-loudspeaker chain or the luminosity of a TV-receiver, with permanent acoustic or visual feedback.

The present invention will be described further by way of example, with reference to the accompanying drawings.

BRIEF DESCRIPTION OF THE DRAWINGS

FIG. 7 is a plan view of another embodiment of the sensor according to the present invention, FIG. 8 is a block diagram of the circuit associated with the sensor of FIG. 7, FIG. 9 is a plan view of another embodiment of the sensor according to the present invention, FIG. 10 is a block diagram of the circuit associated with the sensor of FIG. 9, FIG. 11 is a diagrammatic representation of a bidimensional arrangement of the sensor according to the present invention, FIG. 12 is a block diagram of a 1-bit arrangement of a sensor according to the present invention, FIG. 13 is a diagrammatic representation of a 3-bit arrangement of a sensor according to the present invention, FIG. 14 is a diagrammatic representation of a display with luminous pointer associated with each symbol of an alphabet, FIG. 15 is a diagrammatic a representation of a display with luminous pointer associated with each group of 3 symbols of an alphabet, and FIG. 16 is a plan view of a display with luminous pointer associated with each digit of the display according to the present invention.

DESCRIPTION OF THE PREFERRED EMBODIMENTS

Figure 1:
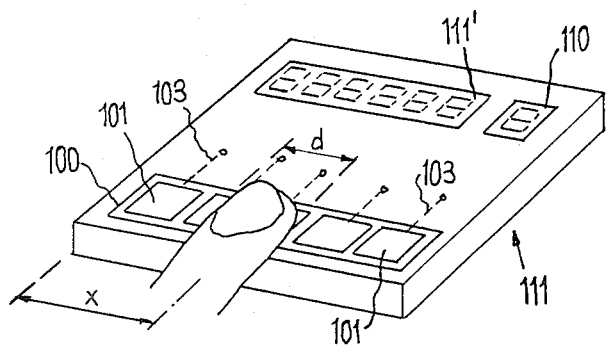
FIG. 1 is a perspective view of an embodiment of a device having a sensor and display panel according to the present invention.

FIG. 1 is a perspective view of the frontal area of a device according to the present invention. It comprises a sensor panel 100 formed of a plurality of identical electrodes 101 placed side by side, a control display 110 and a display 111' of the device or instrument 111 which may be of any suitable type, e.g. a pocket calculator. An output 103 is associated with each electrode 101, the connections 103 being indicated by dashed line in FIG. 1. The electrodes 101 of the sensor 100 deliver on the outputs 103 binary coded information which is representative of the position X of the finger on the sensor. The sensor may be of the capacitive or resistive type.

The N electrodes 101 of such a sensor are capable of defining 2N−1 different positions of the finger, that is 2N−1 coded output signals which are independent of the breadth d of the finger. The 2N−1 positions comprise the N positions corresponding to the N electrodes plus the N−1 positions between two adjacent electrodes respectively.

The 2N−1 coded signals delivered by N bits (N electrodes) may be transcoded to M bits, where M<N, in order to simplify the associated electronic circuit and to eliminate the influence of the breadth of the finger.

Figure 2:
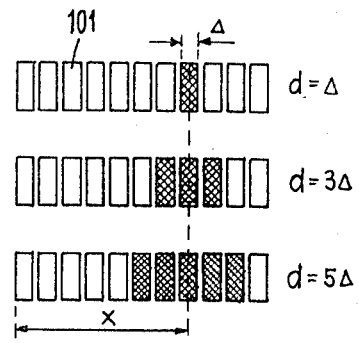
FIG. 2 is a diagrammatic representation of the influence of the breadth of a finger on a sensor with a plurality of electrodes according to the present invention.

FIG. 2 diagrammatically shows, for the same position of the finger, the influence of the breadth of the finger in the case of a sensor comprising an exemplary group of eleven electrodes 101, each of breadth Δ. It can be seen that the arrangement of the electrodes which are activated by the finger depends on the position X of the latter and of its breadth d. It is, therefore, possible that, according to its breadth, the finger activates one or more adjacent electrodes. However, the only interesting desired value is the position X of the finger. This means that it is necessary to find the central electrode amongst a group of activated electrodes.

The search of the central electrode may be done easily by a combinatorial transcoder which shall deliver the same code of the value of X for the three different breadths of the finger indicated in FIG. 2.

Figure 3:
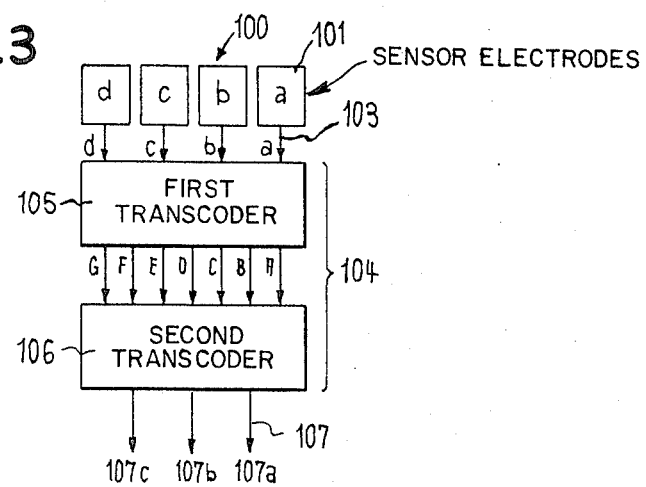
FIG. 3 is a block diagram of a transcoder according to the present invention.

FIG. 3 shows the block diagram of an input device, comprising a transcoder network 104 associated with the four electrodes 101, a, b, c, and d of the sensor 100. The transcoder 104 comprises a first transcoder 105 with 2N−1=2·4−1=7 intermediate outputs corresponding to the seven possible positions X which are defined by the four electrodes of the sensor, and a second transcoder 106 intended to reduce the number of output lines of the circuit. The transcoder 106 delivers information on the position among the seven possible positions in a three bit code, so that the number of lines which is required at the output 107 of the transcoder 106 is reduced to three.

The following Table 1 indicates the logic state of the inputs a, b, c and d of the first transcoder 105 in relation to the seven possible positions determined by the four electrodes of the sensor, the logic state of the outputs 104A–104G (intermediate outputs) of transcoder 105 and the logic state of the outputs 107a, 107b and 107c of second transcoder 106 in a code reduced to three bits. The outputs of transducer 106 are at the same time the outputs of the whole transcoder 104. The Table indicates, for example, that position 3 corresponds to the position of the finger on the single electrode b as well as to the simultaneous activation of electrodes a, b and c by a finger of great breadth. For both cases, the intermediate output indicates C=1, and the final output 107 indicates 3 in binary code indicating that the transcoder 104 selects the true central electrode, which in our example is the electrode b. Table 1 shows also that to each position X of the finger on the sensor 100 corresponds a particular code which is independent of the breadth of the finger at the outputs 107 of the whole transcoder 104.

TABLE 1

| positions | inputs | | | | intermediate outputs | | | | | | | reduced coded outputs | | |
|---|---|---|---|---|---|---|---|---|---|---|---|---|---|---|
| | d | c | b | a | G | F | E | D | C | B | A | 107c | 107b | 107a |
| | 0 | 0 | 0 | 0 | 0 | 0 | 0 | 0 | 0 | 0 | 0 | 0 | 0 | 0 |
| 1 | 0 | 0 | 0 | 1 | 0 | 0 | 0 | 0 | 0 | 0 | 1 | 0 | 0 | 1 |
| 3 | 0 | 0 | 1 | 0 | 0 | 0 | 0 | 0 | 1 | 0 | 0 | 0 | 1 | 1 |
| 2 | 0 | 0 | 1 | 1 | 0 | 0 | 0 | 0 | 0 | 1 | 0 | 0 | 1 | 0 |
| 5 | 0 | 1 | 0 | 0 | 0 | 0 | 1 | 0 | 0 | 0 | 0 | 1 | 0 | 1 |
|  | 0 | 1 | 0 | 1 | 0 | 0 | 0 | 0 | 0 | 0 | 0 | 0 | 0 | 0 |
| 4 | 0 | 1 | 1 | 0 | 0 | 0 | 0 | 1 | 0 | 0 | 0 | 1 | 0 | 0 |
| 3 | 0 | 1 | 1 | 1 | 0 | 0 | 0 | 0 | 1 | 0 | 0 | 0 | 1 | 1 |
| 7 | 1 | 0 | 0 | 0 | 1 | 0 | 0 | 0 | 0 | 0 | 0 | 1 | 1 | 1 |
|  | 1 | 0 | 0 | 1 | 0 | 0 | 0 | 0 | 0 | 0 | 0 | 0 | 0 | 0 |
|  | 1 | 0 | 1 | 0 | 0 | 0 | 0 | 0 | 0 | 0 | 0 | 0 | 0 | 0 |
|  | 1 | 0 | 1 | 1 | 0 | 0 | 0 | 0 | 0 | 0 | 0 | 0 | 0 | 0 |
| 6 | 1 | 1 | 0 | 0 | 0 | 1 | 0 | 0 | 0 | 0 | 0 | 1 | 1 | 0 |
|  | 1 | 1 | 0 | 1 | 0 | 0 | 0 | 0 | 0 | 0 | 0 | 0 | 0 | 0 |
| 5 | 1 | 1 | 1 | 0 | 0 | 0 | 1 | 0 | 0 | 0 | 0 | 1 | 0 | 1 |
| 4 | 1 | 1 | 1 | 1 | 0 | 0 | 0 | 1 | 0 | 0 | 0 | 1 | 0 | 0 |

It is also to be seen that amongst the sixteen possible input states which are provided by the four electrodes 101, a number of states, designated by * in Table 1, never occur. This is due to the fact that it is not possible with one finger only to activate two non-adjacent electrodes. Should, however, such a combination appear, e.g. by accidental contact of another finger with the sensor 100, the output of transcoder 104 assumes the logic state 000 as indicated in the truth table, so that no wrong indication of position will occur.

Figure 4:
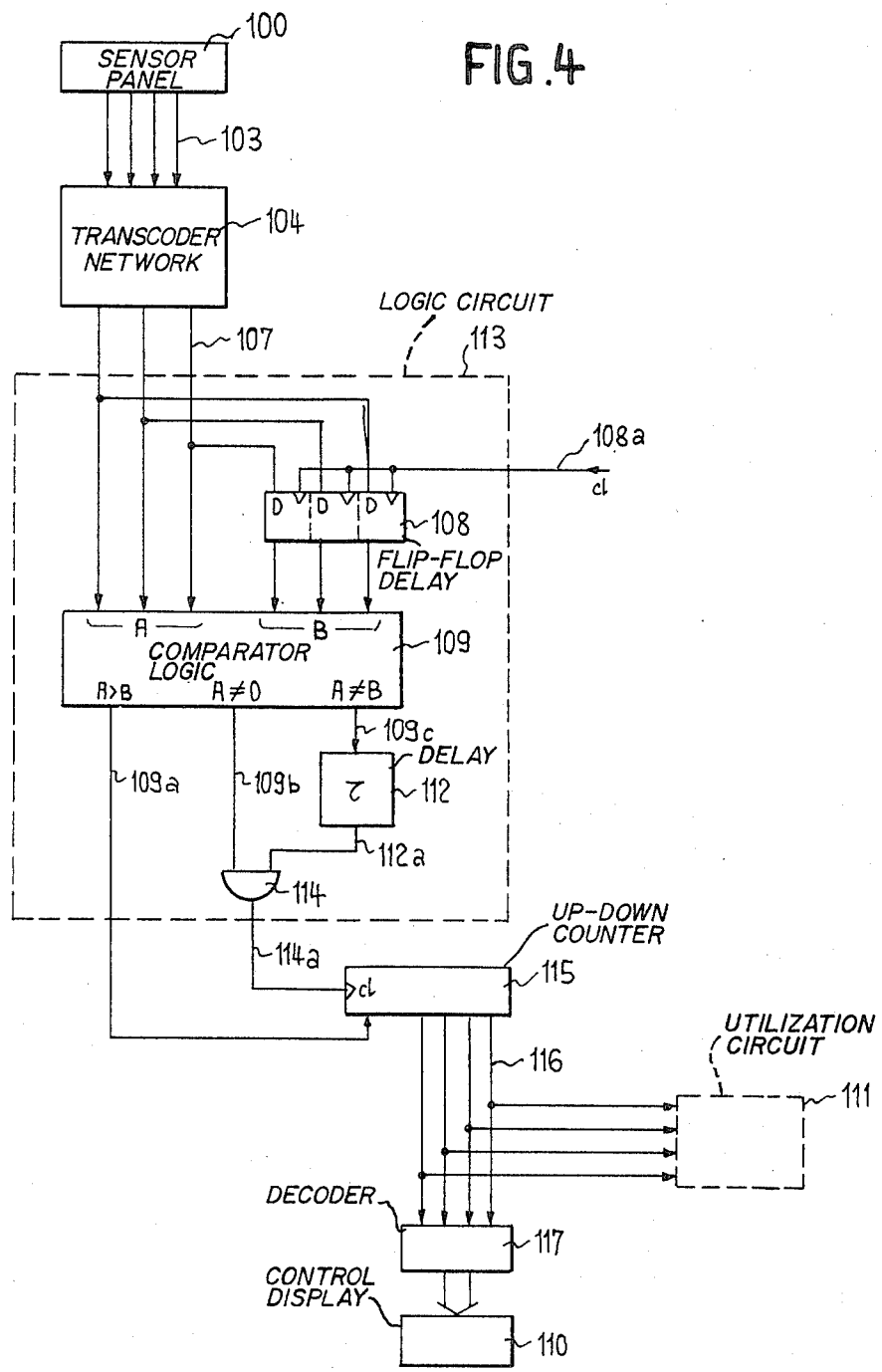
FIG. 4 is a block diagram of an electronic circuit for use in association with the sensor of FIG. 1 and the transcoder of FIG. 3.

FIG. 4 shows the block diagram of a logic circuit 113 associated with the sensor 100 and the transcoder 104. The outputs 107 of the transcoder are connected to a logic circuit 109. The inputs A are directly connected to circuit 109 and the inputs B are connected to this circuit through a delay circuit 108 comprising three flip-flops of type D whose clock inputs 108a receive a signal with a frequency of 100 Hz, for example, delivered by a pulse generator not represented.

The circuit 109, which may be of type 74C 181, for example, is a four bit comparator whose outputs 109a, 109b and 109c are at the logic state 1 when the conditions at its inputs are $A>B$, $A\neq 0$ and $A\neq B$, respectively.

The choice of these criterions is based on the following considerations: The logic state of input A of circuit 109 represents the existing position $X_t$ of the finger on the sensor and the state of input B represents the position $X_{t-1}$ at the preceding clock pulse on 108a. Thereby:

(a) When the condition $A\neq 0$ is realized, the finger is in contact with the sensor.

(b) When the condition $A>B$ is realized the finger has moved to the left. Otherwise it has moved to the right or it has not changed place. This condition determines the direction of counting of an up-down counter 115.

(c) When the condition $A\neq B$ is realized, this indicates that the finger has changed place.

If a horizontal displacement of the finger on the sensor is concerned, the finger has not left the sensor and the condition $A\neq 0$ is still realized; gate 114 transmits to counter 115 the clock pulse which is delivered by the output $A\neq B$ through a delay circuit 112. If a vertical displacement of the finger is concerned, the latter has left the sensor and the condition $A\neq 0$ is no longer true; gate 114 cannot transmit the clock pulse so that the state of the counter 115 does not change. The output 112a of a delay circuit 112 (e.g. 30 ms), controls through the AND gate 114, whose other input is connected to the output 109b, the clock input of the up-down counter 115, the direction of counting of which being determined by the output 109a of circuit 109.

The logic state of counter 115, which is representative of the selected symbol, is transmitted by the outputs to the utilization circuit 111, to the decoder 117 and to the control display 110.

The working principle of the circuit is as follows:

When the finger does not touch the sensor, the output 109b is at the logic state 0 and the counter is blocked. When the finger moves onto the sensor, to each change of state of the outputs 107 corresponds a state 1 of output 109c which after the delay 112, increases or decreases the contents (according to the logic state of 109a) of counter 115.

When the finger leaves the sensor, e.g. when the desired symbol appears on the display 110, the output 109b switches to state 0 and inhibits any additional counting of counter 115 which could occur due to the fact that the finger leaves the sensor by generating many undesired successive logic states.

Figure 5:
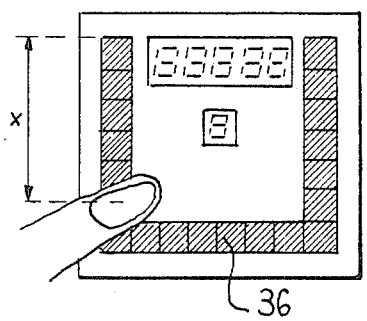
FIG. 5 is a plan view of another embodiment of the arrangement of the sensor of FIG. 1 along a partial circumference on the frontal area of the device.

In summary, the combination of an N-electrode sensor with a decoder allows selection of one among $2N-1$ symbols, whereas the use of the circuit according to FIG. 4 extends the alphabet of possible symbols by means of a reversible counter. The limit in the size of the alphabet is set by the size of the counter. Every time the finger is moved in one direction, on the complete sensor, the counter is incremented by $2N-1$ units. In this way, a rapid selection of a symbol in the group is obtained by a slower movement of the finger until the desired symbol appears on the display. As indicated in FIG. 5, the sensor may be arranged along a partial circumference on the frontal area of the device. This results in a sensor with a great useful length which tends to diminish the manual sensibility normally required to actuate the sensor.

Figure 6:
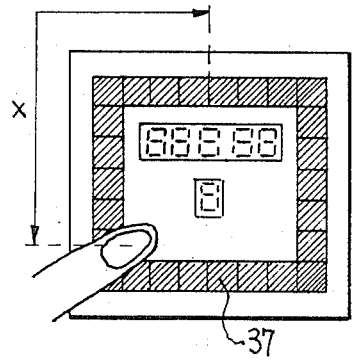
FIG. 6 is a plan view of another embodiment of the arrangement of the sensor of FIG. 1 along a circumference on the frontal area of the device.

In another embodiment shown in FIG. 6, the sensor may be arranged along a full circumference on the periphery of the frontal area of the device.

According to FIG. 7, the sensor 120 comprises only 6 electrodes which permits selections of the 12 symbols of the control display 125. If the user activates a single electrode of the sensor 120, he selects the corresponding symbol. In this way he can select the symbols 2, 4, 6, 8, 0 and C. If he activates simultaneously two adjacent electrodes he selects the symbol which is comprised between these two electrodes. He can thus select the symbols 1, 3, 5, 7, 9 and F.

FIG. 8 shows the block diagram of the circuit associated with the embodiment of FIG. 7.

The sensor 120 is associated with the transcoder 104 from which the outputs 107 are connected on the one hand to a register 128 composed of flip-flops of type D and on the other hand to a logic circuit 113 whose output 114a activates the clock input of the register 128. Only the output 114a of circuit 113 is utilized, which indicates that at one and the same time $A\neq 0$ and $A\neq B$. Therefore, the user has his finger in contact with one or two of the electrodes of the sensor and the output 114a is activated when the transcoder 104 changes of state. The new logic state is loaded in the register 128 when the signal at 114a switches over from 0 to 1.

When the user activates simultaneously two electrodes, the corresponding code representing this logic state is effectively loaded into the register 128 after the delay of circuit 113. When the user raises his finger, he leaves necessarily one electrode before the other and if the delay circuit 113 were not present the code loaded in the register 128 would be the one corresponding to the last single electrode activated. The signals at the outputs 127 of the register 128 are decoded in the decoder 117 to control the control display 125.

According to FIG. 9 it is possible to provide two sensors 121 and 121a while the outputs 107 and 107a of the transcoders 104 and 104a (see FIG. 10) are utilized according to the same particular code. With a control display 126 in the form of a table of symbols it is possible to select a symbol in two steps. A first selection on the sensor 121 lights a whole column of luminous dots (LED) associated with the symbols of this column. A second selection of the sensor 121a switches off all luminous dots but the one which belongs to the line selected by the transducer 121a. It is of course also possible to start with the selection of the lines by the sensor 121a and then with the selection of the columns by the sensor 121.

FIG. 10 shows the block diagram of the circuit associated with the embodiment of FIG. 9. The outputs of sensor 121 are transcoded by the transcoder 104 whose outputs 107 are connected to the inputs of the register 128 which is synchronized by the clock signal 114a delivered by the delay circuit 113. The outputs of the sensor 121a are also transcoded by the transcoder 104a whose outputs 107a are connected to the inputs of the register 128a which is synchronized by the clock signal 114b delivered by the delay circuit 113a. The outputs of the registers 128 and 128a are decoded by the decoder 117 to activate the control display 126.

Another embodiment of the sensor according to the invention is represented in FIG. 11. Here, the capacitive or resistive electrodes a−n, which are sensitive to the finger of the user, are disposed according to a bidimensional arrangement. The search of the symbols is then effected along two axes X and Y and a symbol is determined by the coordinate X and the coordinate Y of the finger on the sensor 35.

FIG. 12 shows a 1-bit arrangement of a sensor according to the invention. The sensor 23 comprises a plurality of identical capacitive or resistive electrodes which are sensitive to the finger of the user and where each electrode is connected to those which are immediately adjacent to it. The displacement of the finger on such a sensor produces pulses the number n of which is a function of the displacement ΔX. These pulses are counted in a counter 24 and each state of the contents of the latter represents a symbol of the alphabet. When the desired symbol, delivered by the decoder 25, appears on the control display 26, the user stops the movement of his finger and gives a validity order to enter the selected data into the instrument.

It is possible to use the sensor of FIG. 12 in the arrangement of FIG. 6. This gives the advantage that the search of a symbol in a great alphabet is very much accelerated.

Another embodiment of the sensor is illustrated in FIG. 13. The sensor 34 comprises a plurality of capacitive or resistive electrodes 29–33 which are arranged in parallel lines wherein each line represents a logic variable, the number of lines corresponding to the number of bits at the output of the sensor. The position X of the finger is delivered directly in the binary code at the output of the sensor.

In order to accelerate the search of the symbols it is possible to provide the device with a display which indicates the general situation of the selected symbol with regard of all or part of the alphabet. Such a particular display, or pointer, may be realized in various ways.

FIG. 14 represents such a particular display. The display comprises e.g. a set of light emitting diodes A–Z, each diode being associated with the symbol of the alphabet which is marked opposite to it. To each position of the finger on the sensor corresponds the lighting of the diode which is representative of the selected symbol. This allows the user to judge at a glance to which distance he is from the desired symbol and thus to control more rapidly the movement of his finger on the sensor. FIG. 14 illustrates the selection of the symbol "E".

Another embodiment of the pointer of FIG. 14 is illustrated in FIG. 15. Here, each light emitting diode is associated with a group of symbols. FIG. 15 shows the selection of one of the symbols of the group "JKL".

Another embodiment of the pointer of FIG. 14 is illustrated in FIG. 16 where each light emitting diode is associated with a digit of a display with seven segments or with luminous dots. This allows to choose at first a group of symbols in an alphabet and then to select one of the symbols of this alphabet by means of the sensor.

The type of the control display associated with the device is determined by the alphabet utilized.

In a first embodiment, the alphabet is essentially numerical which allows the choice of a seven segment display for the control display.

In a second embodiment, the alphabet is alphanumeric and a display with 35 matrix elements or dots is necessary.

Finally, if the device for data input according to the invention is intended to control a timepiece or an instrument having an analog display, the control display may be the analog display of the device itself.

To enter the selected symbol into the utilization circuit of the instrument, it is necessary to give a validity order to this circuit when the desired symbol is displayed. This can be done for example by a special electrode or by a key provided for that purpose which can be actuated by the same finger or simultaneously by another finger.

In a first embodiment, it is possible to provide a delay circuit which generates the validity order a predetermined time after the last change of symbols has taken place on the control display.

In another embodiment, it is possible to enter the selected symbol on the basis of the detection of an abrupt change of the position of the finger on the sensor, e.g. when the finger rapidly leaves the sensor when the desired symbol is selected.

What we claim is:

1. An interactive device for the input of data into an instrument of small dimensions, comprising: at least one manually actuated sensor having a plurality of N electrodes placed side by side, said N electrodes defining a number greater than N of possible positions of a finger on the sensor; a control display unit for displaying the data to be entered into said instrument to permit inspection of said data; a transcoder coupling said sensor to said control display unit for delivering output signals to said control display unit, each discrete output signal of said transcoder corresponding to one of said possible positions of the finger on said sensor; and electronic means coupled to said control display unit for processing said data; said control display unit being responsive to output signals of said transcoder produced by the movement and position of the finger on said sensor to cause the search and selection, respectively, of one symbol to be entered into said instrument from an alphabet of greater than N symbols.

2. A device according to claim 1, wherein said transcoder produces output signals corresponding to one of the possible positions of the finger on said sensor independent of the breadth of the finger.

3. A device according to claim 1, wherein the sensor comprises a plurality of identical electrodes placed side by side, said sensor delivering to its output a coded information signal which is representative of the position of the finger on the sensor.

4. A device according to claim 1, wherein the sensor comprises N electrodes which define (2N−1) possible positions of the finger, the sensor delivering at least (2N−1) coded information signals at its output.

5. A device according to claim 4, wherein said transcoder comprises a first transcoder with (2N−1) outputs each of which corresponding to one of the (2N−1) possible positions of the finger on the sensor and being activated when the finger lies on that position, and a second reduction transcoder to code on M bits the (2N−1) information signals at the output of the first transcoder, the number M being smaller than the number N.

6. A device according to claim 5, wherein said control display unit comprises an electronic circuit which receives said output signals of the transcoder and a clock signal, said electronic circuit delivering, in accordance with the displacement of the finger on the sensor and in relation to a predetermined logic pattern and at least one time delay, clock pulses to the input of an up-down counter and a control signal for the direction of counting of said counter the contents of which being representative of a selected symbol, the output of said counter being connected on the one hand to said instrument in order to enter the selected data and on the other hand through a decoder to the control display.

7. A device according to claim 6, wherein the electronic circuit comprises a comparator of at least M bits receiving directly on its first inputs the output signals of the transcoding circuit and indirectly, through a time delay circuit, said same signals on its second inputs, said comparator delivering output signals in function of the comparison, according to logical criterions, of the signals present at its first and second inputs, one of said output signals being the control signal for the direction of counting of said counter, the two other output signals being combined, one of them directly and the other indirectly, through the time delay circuit, into a logic gate to generate the clock signal of said counter.

8. A device according to claim 6, wherein the size of the alphabet of the data to be entered into the instrument is larger than the number of positions defined by the sensor and depends on the capacity of said up-down counter.

9. A device according to claim 1, wherein the sensor is arranged along a half circumference on the frontal area of the device.

10. A device according to claim 1, wherein the sensor is arranged along a full circumference on the frontal area of the device.

11. A device according to claim 1, wherein the outputs of the transcoder are utilized in accordance with a particular code according to which the activation of one of the electrodes of the sensor selects the symbol associated with that electrode and the simultaneous activation of two adjacent electrodes of the sensor selects the symbol which is associated with the space between these electrodes.

12. A device according to claim 11, wherein the outputs of the transcoder are connected on the one hand to the inputs of a register and on the other hand to a logic circuit, the output signal of said logic circuit being connected as a clock signal for the register, permitting the introduction of data into said register.

13. A device according to claim 1, wherein said device comprises two sensors, each of said sensors comprising at least one electrode, and a control display in the form of a series of elements arranged to correspond to a table of symbols, the activation of a first sensor causing activation of all of said elements associated with the symbols of one column of said table and the subsequent activation of the second sensor causing deactivation of all elements in said column but the one which belongs to the row of said table selected by said second sensor.

14. A device according to claim 13, wherein each of said sensors is associated with a transcoding circuit being connected to a corresponding logic circuit and to a corresponding register which receives a clock signal delivered by the corresponding logic circuit, the outputs of the registers being decoded by a decoder to activate the control display.

15. A device according to claim 1, wherein the electrodes of the sensor are disposed according to a bidimensional arrangement, the sensor delivering coded information output signals associated with the coordinates X and Y of the finger on two axes.

16. A device according to claim 1, wherein the sensor comprises a plurality of identical electrodes, each electrode being connected to those immediately adjacent to it, the search of the desired symbol being executed by variation of the position of the finger on the sensor.

17. A device according to claim 1, wherein the sensor comprises a plurality of electrodes which are arranged in parallel lines, each line representing a logic variable of the output signal and wherein the position of the finger on the sensor is delivered directly in binary coded form to the output of the sensor.

18. A device according to claim 1, wherein said control display is formed by at least one luminous pointer corresponding to preselected divisions of an alphabet.

19. A device according to claim 1, wherein said control display is formed by luminous pointers corresponding to the digits of a display with seven segments.

20. A device according to claim 1, wherein the sensor is of resistive type.

21. A device according to claim 1, wherein the sensor is of capacitive type.

22. A device according to claim 1, wherein said control display is a numerical display with seven segments.

* * * * *